United States Patent
Hirai et al.

(10) Patent No.: US 9,735,226 B1
(45) Date of Patent: Aug. 15, 2017

(54) POWER MODULE

(71) Applicant: Mitsubishi Electric Corporation, Tokyo (JP)

(72) Inventors: Toshinari Hirai, Tokyo (JP); Tetsujiro Tsunoda, Tokyo (JP); Toru Ichimura, Tokyo (JP); Masanori Yamamoto, Tokyo (JP); Hiroshi Fujita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/262,024

(22) Filed: Sep. 12, 2016

(30) Foreign Application Priority Data

Jan. 28, 2016 (JP) .................................. 2016-014256

(51) Int. Cl.
*H01L 29/16* (2006.01)
*H01L 49/02* (2006.01)

(52) U.S. Cl.
CPC .......... *H01L 28/40* (2013.01); *H01L 29/1608* (2013.01)

(58) Field of Classification Search
CPC ............................ H01L 29/1608; H01L 28/40
USPC ......................................................... 257/532
See application file for complete search history.

(56) References Cited

U.S. PATENT DOCUMENTS

| | | | | |
|---|---|---|---|---|
| 6,201,696 B1* | 3/2001 | Shimizu | ................. | H01L 23/24 165/80.2 |
| 2004/0179341 A1* | 9/2004 | Kimoto | ................. | H02M 7/003 361/704 |
| 2005/0161809 A1* | 7/2005 | Nakatsu | ................. | H02M 7/003 257/734 |
| 2006/0214186 A1* | 9/2006 | Hamidi | ................. | H01L 23/24 257/177 |
| 2012/0014059 A1* | 1/2012 | Zeng | ................. | H02M 7/003 361/690 |
| 2012/0162947 A1* | 6/2012 | O'Donnell | ................. | H01L 25/16 361/783 |
| 2013/0082283 A1* | 4/2013 | Otsuki | ................. | H01L 24/49 257/77 |
| 2013/0258736 A1* | 10/2013 | Higuchi | ................. | H01L 25/072 363/131 |

(Continued)

FOREIGN PATENT DOCUMENTS

| | | |
|---|---|---|
| JP | 2005-328651 A | 11/2005 |
| JP | 2007-151331 A | 6/2007 |
| JP | 2011-067045 A | 3/2011 |

*Primary Examiner* — Moazzam Hossain
(74) *Attorney, Agent, or Firm* — Studebaker & Brackett PC

(57) ABSTRACT

Provided is a power module having a sufficient space in which a large electronic component in size is disposed, and having yield strength against external stresses, such as vibrations. A power module includes: an insulating substrate; a semiconductor element mounted above the insulating substrate; a sealant sealing the insulating substrate and semiconductor element, and forming the outer shape of the power module; and a pair of terminals disposed on the sealant, in both ends of the sealant in a width direction of the power module in an upright manner. The pair of terminals are spaced from each other by a distance greater than the width of a film capacitor being a first electronic component mounted on the bottom surface of a control substrate being a circuit substrate coupled to tips of the pair of terminals. The pair of terminals are longer in a height direction than the film capacitor.

7 Claims, 5 Drawing Sheets

(56) References Cited

U.S. PATENT DOCUMENTS

| | | | |
|---|---|---|---|
| 2014/0167241 A1* | 6/2014 | Matsuoka | H01L 23/24 257/690 |
| 2015/0115423 A1* | 4/2015 | Yamashita | H01L 23/49575 257/675 |
| 2016/0095221 A1* | 3/2016 | Ramachandran | H05K 1/115 361/783 |
| 2017/0012018 A1* | 1/2017 | Watanabe | H01L 24/48 257/734 |

* cited by examiner

POWER MODULE

BACKGROUND OF THE INVENTION

Field of the Invention

The present invention relates to power modules for reducing the space utilized by electronic components mounted on circuit substrates used for, for instance, controlling motors of industrial equipment or consumer equipment.

Description of the Background Art

A conventional power module, when driven, can generate an off-surge voltage. The power module can be damaged by the surge voltage if a voltage greater than a maximum rated voltage of the power module is applied to the power module. To reduce or eliminate the surge voltage, a film capacitor, called a snubber capacitor, needs to be mounted on a circuit substrate near the power module. Accordingly, a power module that has a capacitor embedded inside the power module has been proposed (for instance, see Japanese Patent Application Laid-Open No. 2007-151331 and Japanese Patent Application Laid-Open No. 2005-328651).

However, a high dielectric material used for capacitors is a sintered body. It is difficult to sinter a dielectric together with a lead at high temperature when a large capacitor in size is formed inside the conventional power module. As a result, such a large capacitor cannot be mounted inside the power module.

Further, the film capacitor that has a high breakdown voltage and a high frequency characteristic is large in size, and the film capacitor thus requires a large space when mounted on the circuit substrate. Hence, it is difficult to mount the large capacitor between the circuit substrate and the power module mounted on the circuit substrate. Because of this difficulty, the circuit substrate has a restriction where, for instance, tall electronic components need to be mounted on a surface opposite to a surface on which the power module is mounted. Accordingly, Japanese Patent Application Laid-Open No. 2011-67045 discloses an apparatus including a snubber capacitor outside a power module, for instance.

Although apparatuses described in Japanese Patent Application Laid-Open No. 2007-151331 and Japanese Patent Application Laid-Open No. 2005-328651 are configured such that capacitors are disposed inside power modules, as described above, it is difficult to dispose large capacitors in size inside the power modules.

Furthermore, the apparatus described in Japanese Patent Application Laid-Open No. 2011-67045 is configured such that the capacitor is disposed outside the power module, and that an electrode terminal is externally coupled between the power module and a circuit substrate. As a result, the electrode terminal unfortunately has a poor contact due to external stresses, such as vibrations.

SUMMARY OF THE INVENTION

It is an object of the present invention to provide a power module that has a sufficient space in which a large electronic component in size is disposed, and that has increased yield strength against external stresses, such as vibrations.

The power module according to an aspect of the present invention includes an insulating substrate, a semiconductor element mounted above the insulating substrate, a sealant, and a pair of terminals. The sealant seals the insulating substrate and the semiconductor element. The sealant forms the outer shape of the power module. The pair of terminals are disposed on the sealant, in both ends of the sealant in a width direction of the power module in an upright manner. The pair of terminals are spaced from each other in the width direction by a distance greater than the width of at least one first electronic component mounted on the bottom surface of a circuit substrate coupled to tips of the pair of terminals. The pair of terminals are longer in a height direction than the at least one first electronic component, where the height direction is orthogonal to the width direction.

The pair of terminals are spaced from each other in the width direction by the distance greater than the width of the at least one first electronic component mounted on the bottom surface of the circuit substrate coupled to the tips of the pair of terminals. The pair of terminals are longer in the height direction than the at least one first electronic component, where the height direction is orthogonal to the width direction. Such a configuration enables the power module to have the sufficient space for disposing the large electronic component in size between the circuit substrate and the power module. Further, the circuit substrate, on which the first electronic component is mounted, is coupled to the tips of the pair of terminals. Hence, the pair of terminals are capable of supporting the circuit substrate. This enables the power module to have increased yield strength against the external stresses, such as the vibrations.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

The following describes a first preferred embodiment of the present invention with reference to a drawing.

Figure 1:
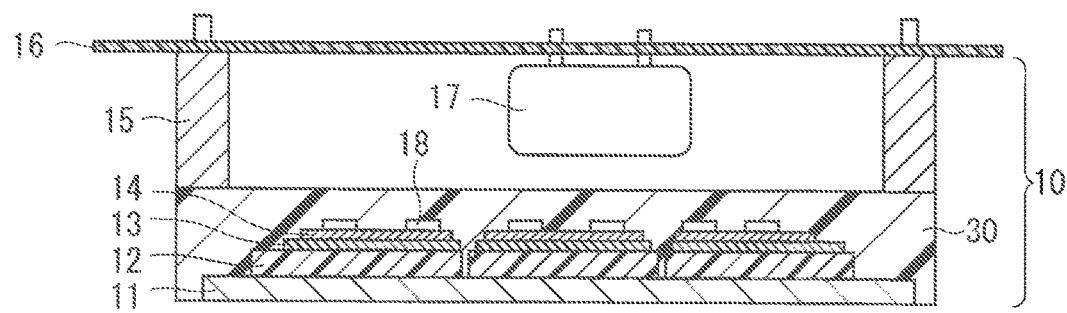
FIG. 1 is a cross-sectional view of a power module according to a first preferred embodiment fixed to a control substrate.

FIG. 1 is a cross-sectional view of a power module 10 according to the first preferred embodiment fixed to a control substrate 16. As illustrated in FIG. 1, the power module 10 includes a base plate 11, insulating substrates 12, semiconductor elements 18, a sealant 30, and a pair of terminals 15. The insulating substrates 12 are each fixed on the top surface of the base plate 1. Moreover, the insulating substrates 12 each include a pattern 13 formed on the top surface of the insulating substrate 12. The semiconductor elements 18 are fixed (mounted) above the top surfaces of the patterns 13 through solder 14. The insulating substrates 12 are each made of a material having an excellent insulation characteristic and thermal conductivity.

Here, the insulating substrate 12 and the base plate 11 may be an integral structure. Moreover, the semiconductor elements 18 are each an IGBT or a free wheel diode (hereinafter referred to as FWDi), and may include a wide bandgap semiconductor, such as a silicon carbide (SiC) element.

The sealant 30 seals the insulating substrate 12 and the semiconductor element 18 (to be more specific, the sealant 30 seals the base plate 11, the insulating substrate 12 and the semiconductor element 18), and the sealant 30 forms the outer shape of the power module 10. The pair of terminals 15 are disposed and fixed on the sealant 30, in both ends of the sealant 30 in a width direction of the power module 10 in an upright manner. It is noted that the width direction of the power module 10 is a horizontal direction in FIG. 1. In addition, the width direction of the power module 10 will be just also referred to as a width direction.

The control substrate 16 (circuit substrate) is disposed on the upper side of the power module 10. The power module 10 is joined (coupled) to the control substrate 16 through the pair of terminals 15. To be more specific, the control substrate 16 is joined to tips of the pair of terminals 15. A film capacitor 17 (first electronic component) is mounted on the bottom surface of the control substrate 16.

The pair of terminals 15 are spaced from each other in the width direction by a distance greater than the width of the film capacitor 17, which is mounted on the bottom surface of the control substrate 16, which is joined to the tips of the pair of terminals 15. The pair of terminals 15 are longer in a height direction than the film capacitor 17. In other words, the pair of terminals 15 each have a length for a sufficient space necessary to dispose the film capacitor 17 inside the power module 10 (between the control substrate 16 and the power module 10), more specifically, between the control substrate 16 and sealant 30, and between the pair of terminals 15. Here, the height direction is a direction orthogonal to the width direction of the power module 10.

As described above, the power module 10 according to the first preferred embodiment is configured such that the pair of terminals 15 are spaced from each other in the width direction by the distance greater than the width of the film capacitor 17, which is mounted on the bottom surface of the control substrate 16, which is coupled to the tips of the pair of terminals 15. The power module 10 is also configured such that the pair of terminals 15 are longer in the height direction than the film capacitor 17. Hence, such a configuration enables the power module 10 to have a sufficient space for disposing a large electronic component in size, such as the film capacitor 17, inside the power module 10, i.e., between the control substrate 16 and the power module 10.

This eliminates the need for the top surface of the control substrate 16 to have a sufficient space in which the film capacitor 17 is disposed. Hence, the control substrate 16 is small in size. Consequently, this provides miniaturization in control equipment that includes the control substrate 16, miniaturization in packaging, and efficient transportation method. These advantages achieves a reduction in manufacturing cost for the control equipment and a reduction in consumption of energy.

Further, since the control substrate 16, on which the film capacitor 17 is mounted, is coupled to the tips of the pair of terminals 15, the pair of terminals 15 are capable of supporting the control substrate 16. This enables the power module 10 to have increased yield strength against external stresses, such as vibrations.

Second Preferred Embodiment

Figure 2:
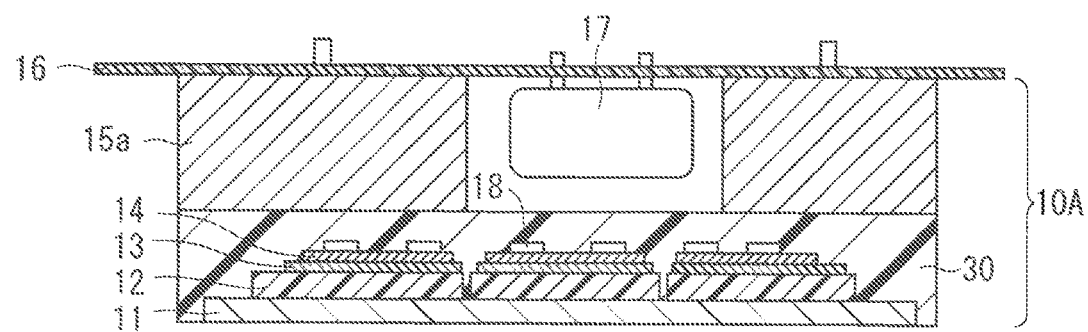
FIG. 2 is a cross-sectional view of a power module according to a second preferred embodiment fixed to a control substrate.

The following describes a power module 10A according to a second preferred embodiment. FIG. 2 is a cross-sectional view of a power module 10A according to a second preferred embodiment fixed to a control substrate 16. In the second preferred embodiment, like elements described in the first preferred embodiment will be denoted by like reference symbols. Thus, descriptions of these like elements will be omitted.

In the second preferred embodiment, the power module 10A includes a pair of terminals 15a instead of the pair of terminals 15. The pair of terminals 15a are wider than a film capacitor 17. The pair of terminals 15a have inner side-surfaces adjacent to the side surfaces of the film capacitor 17 in a width direction.

As described above, the power module 10A according to the second preferred embodiment is configured such that the pair of terminals 15a are wider than the film capacitor 17. Such a configuration enables the power module 10A to have further increased yield strength against external stresses, such as vibrations when compared with the power module 10 in the first preferred embodiment.

Third Preferred Embodiment

Figure 3:
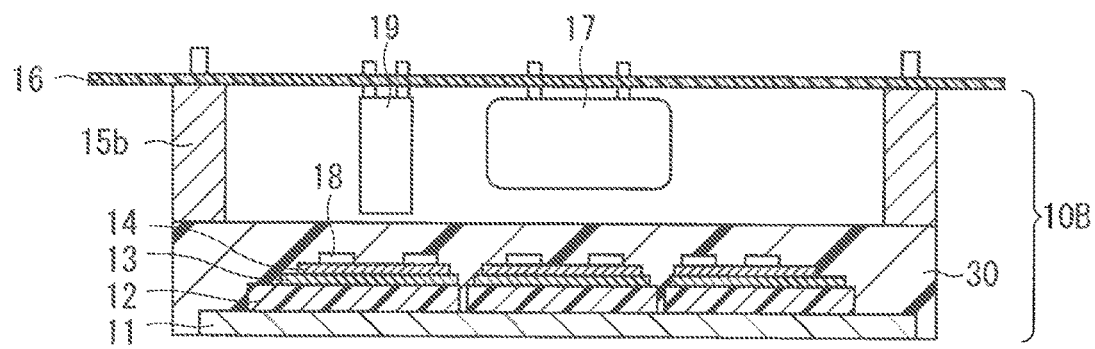
FIG. 3 is a cross-sectional view of a power module according to a third preferred embodiment fixed to a control substrate.

The following describes a power module 10B according to a third preferred embodiment. FIG. 3 is a cross-sectional view of a power module 10B according to the third preferred embodiment fixed to a control substrate 16. In the third preferred embodiment, like elements described in the first and second preferred embodiments will be denoted by like reference symbols. Thus, descriptions of these like elements will be omitted.

In the third preferred embodiment, the power module 10B includes a pair of terminals 15b instead of the pair of terminals 15 with respect to the first preferred embodiment. A film capacitor 17 and a cement resistor 19 (second electronic component) are mounted on the bottom surface of the control substrate 16. The cement resistor 19 is mounted on the bottom surface of the control substrate 16, at a position adjacent to the film capacitor 17.

The pair of terminals 15b are spaced from each other in a width direction by a distance greater than the sum of the width of the film capacitor 17 and the width of the cement resistor 19. The pair of terminals 15b are longer in a height direction than the film capacitor 17 and the cement resistor 19. To be more specific, the cement resistor 19 is higher than the film capacitor 17; and the pair of terminals 15b are higher in the height direction than the cement resistor 19. It is noted that the pair of terminals 15b are as wide as the pair of terminals 15.

Hence, such a configuration enables the power module 10B to have a sufficient space for disposing large electronic components in size, such as the film capacitor 17 and the cement resistor 19, inside the power module 10B, i.e., between the control substrate 16 and the power module 10B. It is noted that the cement resistor 19 is a resistor intended for use in large electric power used for an over-current detection circuit or current monitor.

As described above, the power module 10B according to the third preferred embodiment is configured such that the pair of terminals 15b are spaced from each other in the width direction by the distance greater than the sum of the width of the film capacitor 17 and the width of the cement resistor 19, which is mounted on the bottom surface of the control substrate 16, at the position adjacent to the film capacitor 17. The power module 10B is also configured such that the pair of terminals 15b are higher in the height direction than the film capacitor 17 and the cement resistor 19. Hence, such a configuration enables the power module 10B to have the sufficient space for disposing the large electronic components in size, such as the film capacitor 17 and the cement resistor 19 inside the power module 10B.

Fourth Preferred Embodiment

Figure 4:
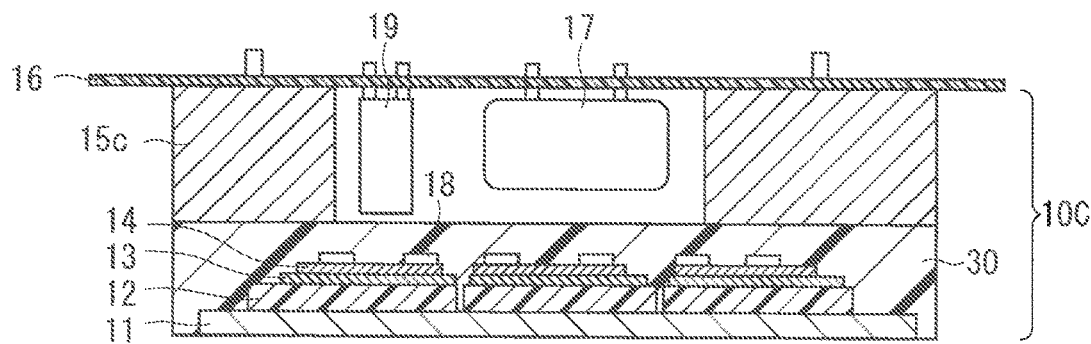
FIG. 4 is a cross-sectional view of a power module according to a fourth preferred embodiment fixed to a control substrate.

The following describes a power module 10C according to a fourth preferred embodiment. FIG. 4 is a cross-sectional view of the power module 10C according to the fourth preferred embodiment fixed to a control substrate 16. In the fourth preferred embodiment, like elements described in the first to third preferred embodiment will be denoted by like reference symbols. Thus, descriptions of these like elements will be omitted.

In the fourth preferred embodiment, the power module 10C includes a pair of terminals 15c instead of the pair of terminals 15b with respect to the third preferred embodiment. The pair of terminals 15c are wider than a film capacitor 17 or a cement resistor 19. The pair of terminals 15c have inner side-surfaces each adjacent to a side surface of the film capacitor 17 or a side surface of the cement resistor 19 in a width direction.

As described above, the power module 10C according to the fourth preferred embodiment is configured such that the pair of terminals 15c are wider than the film capacitor 17 or the cement resistor 19. Hence, such a configuration enables the power module 10C to have further increased yield strength against external stresses, such as vibrations when compared with the power module 10B in the third preferred embodiment.

Fifth Preferred Embodiment

Figure 5:
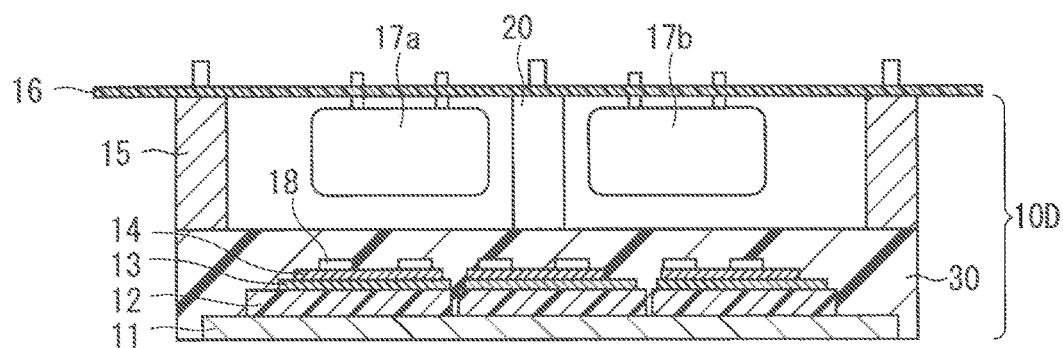
FIG. 5 is a cross-sectional view of a power module according to a fifth preferred embodiment fixed to a control substrate.

The following describes a power module 10D according to a fifth preferred embodiment. FIG. 5 is a cross-sectional view of the power module 10D) according to the fifth preferred embodiment fixed to a control substrate 16. In the fifth preferred embodiment, like elements described in the first to fourth preferred embodiments will be denoted by like reference symbols. Thus, descriptions of like elements will be omitted.

In the fifth preferred embodiment film capacitors 17a and 17b are mounted on the bottom surface of the control substrate 16. Moreover, the power module 10D, with respect to the first preferred embodiment, further includes a terminal 20 that is disposed on a sealant 30, in the middle of the sealant 30 in a width direction of the power module 10D in an upright manner, and that is coupled to the control substrate 16 at a tip of the terminal 20. The terminal 20 that has no electrode is disposed between the film capacitors 17a and 17b. Moreover, the terminal 20 is as long in a height direction as a pair of terminals 15 in a height direction, and the terminal 20 is as wide as the pair of terminals 15.

As described above, the power module 10D according to the fifth preferred embodiment further includes the terminal 20 that is disposed on the sealant 30, in the middle of the sealant 30 in the width direction of the power module 10D in an upright manner, and that is coupled to the control substrate 16 at the tip of the terminal 20. Hence, such a configuration enables the power module 10D to have further increased yield strength against external stresses, such as vibrations when compared with the power module 10 in the first preferred embodiment.

Sixth Preferred Embodiment

Figure 6:
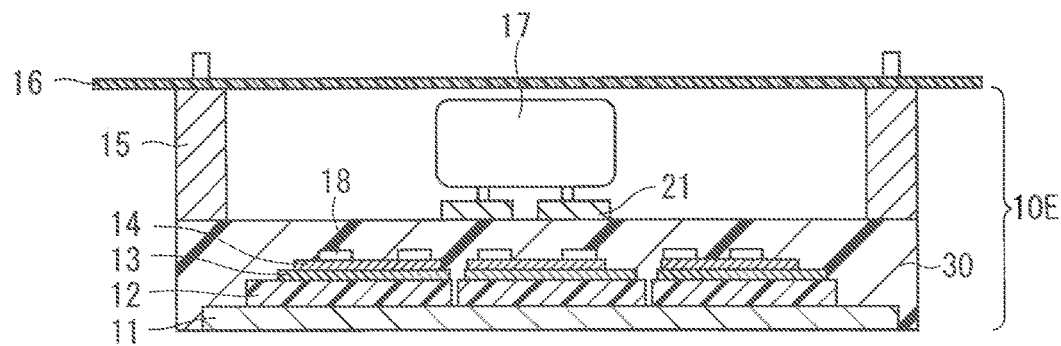
FIG. 6 is a cross-sectional view of a power module according to a sixth preferred embodiment fixed to a control substrate.

The following described a power module 10E according to a six preferred embodiment. FIG. 6 is a cross-sectional view of the power module 10E according to the sixth preferred embodiment fixed to a control substrate 16. In the sixth preferred embodiment, like elements described in the first to fifth preferred embodiments will be denoted by like reference symbols. Thus, descriptions of these like elements will be omitted.

The film capacitor 17 in the first preferred embodiment is mounted on the bottom surface of the control substrate 16. In contrast, a film capacitor 17 in the six preferred embodiment is mounted above the top surface of a sealant 30. The power module 10E further includes a terminal 21 for disposing a film capacitor 17 above the sealant 30. A pair of terminals 15 are longer in a height direction than the film capacitor 17 disposed on the terminal 21.

As described above, the power module 10E according to the sixth preferred embodiment further includes the terminal 21 for disposing the film capacitor 17 above the sealant 30. Such a configuration enables a reduction in a space in which the film capacitor 17 on the bottom surface of the control substrate 16 is disposed.

Seventh Preferred Embodiment

Figure 7:
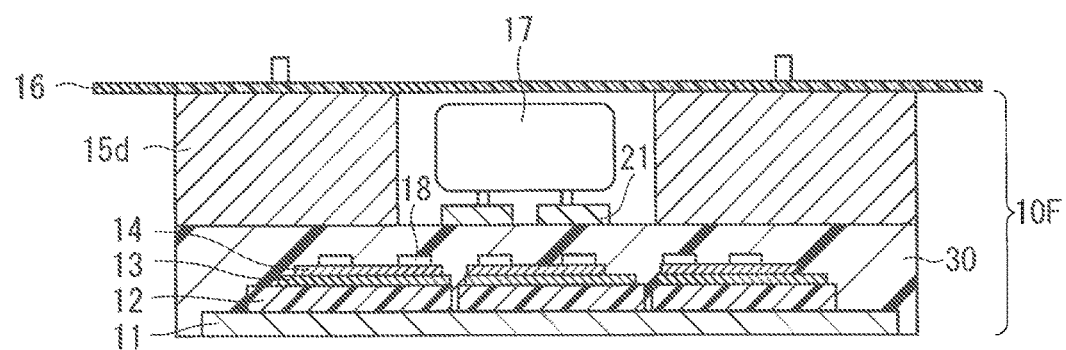
FIG. 7 is a cross-sectional view of a power module according to a seventh preferred embodiment fixed to a control substrate.

The following described a power module 10F according to a seventh preferred embodiment. FIG. 7 is a cross-sectional view of the power module 10F according to the seventh preferred embodiment fixed to a control substrate 16. In the seventh preferred embodiment, like elements described in the first to sixth preferred embodiments will be denoted by like reference symbols. Thus, descriptions of like elements will be omitted.

In the seventh preferred embodiment, the power module 10F includes a pair of terminals 15d instead of pair of terminals 15 with respect to the power module 10E in the sixth preferred embodiment. The pair of terminals 15d are wider than a film capacitor 17.

As described above, the power module 10F according to the seventh preferred embodiment is configured such that the pair of terminals 15d are wider than the film capacitor 17. Such a configuration enables the power module 10F to have further increased yield strength against external stresses, such as vibrations when compared with the power module 10E in the sixth preferred embodiment.

Eighth Preferred Embodiment

Figure 8:
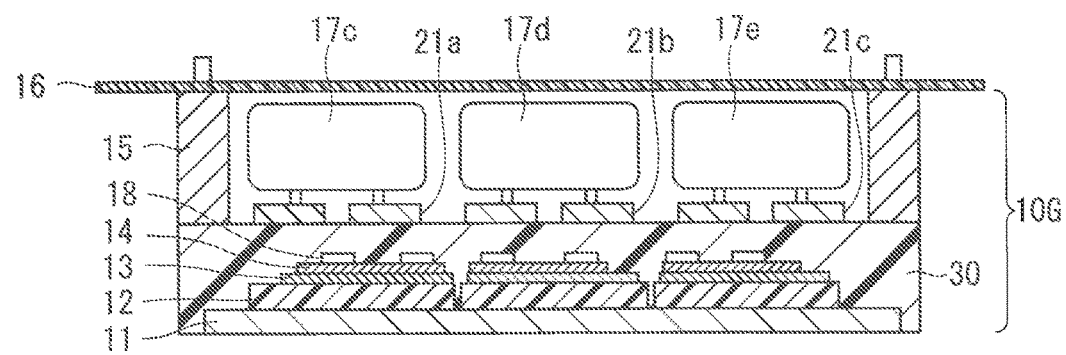
FIG. 8 is a cross-sectional view of a power module according to an eighth preferred embodiment fixed to a control substrate.

The following described a power module 10G according to an eighth preferred embodiment. FIG. 8 is a cross-sectional view of the power module 10G according to the eighth preferred embodiment fixed to a control substrate 16.

In the eighth preferred embodiment, like elements described in the first to seventh preferred embodiments will be denoted by like reference symbols. Thus, descriptions of like elements will be omitted.

In the eighth preferred embodiment, the power module 10G is a six-in-one module that includes six IGBT chips and six FWDi chips for reflux, and that constitutes a three-phase bridge. The power module 100 includes three (a plurality of) terminals 21a, 21b, and 21c for coupling three (a plurality of) film capacitors 17c, 17d and 17e to respective arms of the three-phase bridge.

In other words, the three film capacitors 17c, 17d, and 17e are mounted above the top surface of a sealant 30, at positions adjacent to each other in a width direction of the power module 10G. The power module 10G further includes the three terminals 21a, 21b, and 21c for disposing each of the three film capacitors 17c, 17d, and 17e above the sealant 30.

As described above, the power module 10G according to the eighth preferred embodiment is configured such that the tree film capacitors 17c, 17d, and 17e are mounted at the positions adjacent to each other in the width direction of the power module 10G. The power module 10G further includes the plurality of terminals 21a, 21b, and 21 for disposing each of the plurality of capacitors 17c, 17d, and 17e above the sealant 30. Consequently, such a configuration enables the capacitors to have large capacitances at a position adjacent to semiconductor elements 18 inside the power module 10G. This minimizes a surge voltage generated in the semiconductor elements 18.

Ninth Preferred Embodiment

Figure 9:
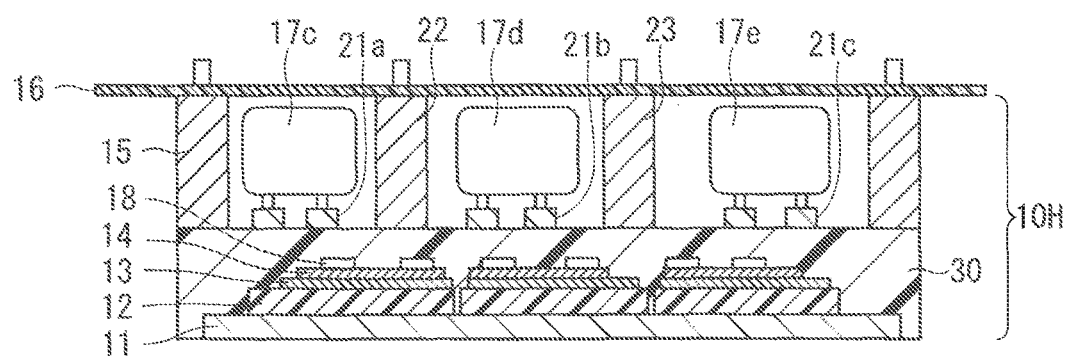
FIG. 9 is a cross-sectional view of a power module according to a ninth preferred embodiment fixed to a control substrate.

The following described a power module 1011 according to a ninth preferred embodiment. FIG. 9 is a cross-sectional view of the power module 10H according to the ninth preferred embodiment fixed to a control substrate 16. In the ninth preferred embodiment, like elements described in the first to eighth preferred embodiments will be denoted by like reference symbols. Thus, descriptions of like elements will be omitted.

In ninth preferred embodiment, the power module 10H, with respect to the eighth preferred embodiment, further includes terminals 22 and 23 disposed on a sealant 30, between adjacent film capacitors in an upright manner, where the terminals 22 and 23 are coupled to the control substrate 16 at tips of the terminals 22 and 23. The terminals 22 and 23 that have no electrodes are respectively disposed between film capacitors 17c and 17d, and between film capacitors 17d and 17e. The terminals 22 and 23 are as long in a height direction as the pair of terminals 15 in a height direction, and the terminals 22 and 23 are as wide as the pair of terminals 15.

As described above, the power module 10H according to the ninth preferred embodiment further includes the terminals 22 and 23 disposed on the sealant 30, between the adjacent film capacitors in the upright manner, where the terminals 22 and 23 are coupled to the control substrate 16 at the tips of the terminals 22 and 23. Such a configuration enables the power module 1011 to have further increased yield strength against external stresses, such as vibrations when compared to the power module 10G in the eighth preferred embodiment.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power module comprising:
an insulating substrate;
a semiconductor element mounted above said insulating substrate;
a sealant sealing said insulating substrate and said semiconductor element, said sealant forming an outer shape of said power module; and
a pair of terminals disposed on said sealant, in both ends of said sealant in a width direction of said power module in an upright manner,
wherein said pair of terminals are spaced from each other in said width direction by a distance greater than a width of at least one first electronic component mounted on a bottom surface of a circuit substrate coupled to tips of said pair of terminals,
wherein said pair of terminals are longer in a height direction than said at least one first electronic component, said height direction being orthogonal to said width direction, and
wherein said pair of terminals are wider in said width direction than said at least one first electronic component.

2. The power module according to claim 1,
wherein said pair of terminals are spaced from each other in said width direction by a distance greater than a sum of a width of sai d at least one first electronic component and a width of a second electronic component mounted on said bottom surface of said circuit substrate, at a position adjacent to said at least one first electronic component, and
wherein said pair of terminals are longer in said height direction than said at least one first electronic component and said second electronic component.

3. The power module according to claim 1, wherein said pair of terminals are wider than said at least one first electronic component or said second electronic component.

4. The power module according to claim 1, further comprising a terminal disposed on said sealant, in a middle of said sealant in said width direction in an upright manner, said terminal being coupled to said circuit substrate at a tip of said terminal.

5. The power module according to claim 1, further comprising a terminal for disposing said at least one first electronic component above said sealant.

6. The power module according to claim 1,
wherein said at least one first electronic component comprises a plurality of first electronic components,
wherein said plurality of first electronic components are mounted at positions adjacent to each other in said width direction, and
wherein said power module further comprises a plurality of terminals for disposing each of said plurality of first electronic components above said sealant.

7. The power module according to claim 6, further comprising a terminal disposed on said sealant, between said plurality of first electronic components adjacent to each other in an upright manner, said terminal being coupled to said circuit substrate at a tip of said terminal.

* * * * *